United States Patent
Chung et al.

(10) Patent No.: US 7,873,052 B2
(45) Date of Patent: Jan. 18, 2011

(54) SYSTEM AND METHOD FOR CONTROLLING PROCESS END-POINT UTILIZING LEGACY END-POINT SYSTEM

(75) Inventors: Sherk Chung, Emeryville, CA (US); Tomislav Lozic, Morgan Hill, CA (US); Joseph Raymond Monkowski, Danville, CA (US); Geoffrey Rodney Wong, Belmont, CA (US)

(73) Assignee: Pivotal Systems Corporation, Pleasanton, CA (US)

( * ) Notice: Subject to any disclaimer, the term of this patent is extended or adjusted under 35 U.S.C. 154(b) by 823 days.

(21) Appl. No.: 11/787,654

(22) Filed: Apr. 16, 2007

(65) Prior Publication Data

US 2008/0253377 A1 Oct. 16, 2008

(51) Int. Cl.
*H04L 12/28* (2006.01)
(52) U.S. Cl. ............... 370/395.3; 156/345.24
(58) Field of Classification Search ................. 700/175; 702/34; 156/345
See application file for complete search history.

(56) References Cited

U.S. PATENT DOCUMENTS

| | | | | |
|---|---|---|---|---|
| 5,587,931 A | * | 12/1996 | Jones et al. | 702/34 |
| 6,161,055 A | * | 12/2000 | Pryor | 700/175 |
| 6,468,222 B1 | * | 10/2002 | Mault et al. | 600/531 |
| 6,587,704 B1 | * | 7/2003 | Fine et al. | 600/335 |
| 6,663,469 B2 | * | 12/2003 | Kimura et al. | 451/41 |
| 6,709,312 B2 | * | 3/2004 | Mautz | 451/5 |
| 7,075,094 B2 | * | 7/2006 | Feldbaum et al. | 250/492.2 |
| 7,591,923 B2 | * | 9/2009 | Mitrovic et al. | 156/345.24 |

* cited by examiner

*Primary Examiner*—Thong H Vu
(74) *Attorney, Agent, or Firm*—Townsend Townsend & Crew LLP

(57) ABSTRACT

Embodiments in accordance with the present invention allow a second end-point determination (EPD) system to actively control the end-pointing of a semiconductor process chamber, by leveraging a legacy EPD system that is already integrated with the chamber. In one embodiment, the second EPD system controls a shutter that regulates the amount of light transmitted between a plasma light source and an optical emission spectroscopy (OES) sensor of the legacy OES EPD system. In this embodiment, the legacy OES EPD system is pre-configured to call end-point when an artificial end-point condition occurs, i.e. the intensity of light falls below a pre-set threshold. When the second EPD system determines an actual end-point condition has been reached, it closes the shutter which, causes the light intensity being read by the OES sensor to fall below the pre-set threshold. This in turn triggers an end-point command to the chamber from the legacy OES EPD system.

19 Claims, 3 Drawing Sheets

High level process flow of new EPD system for calling end-point on the tool

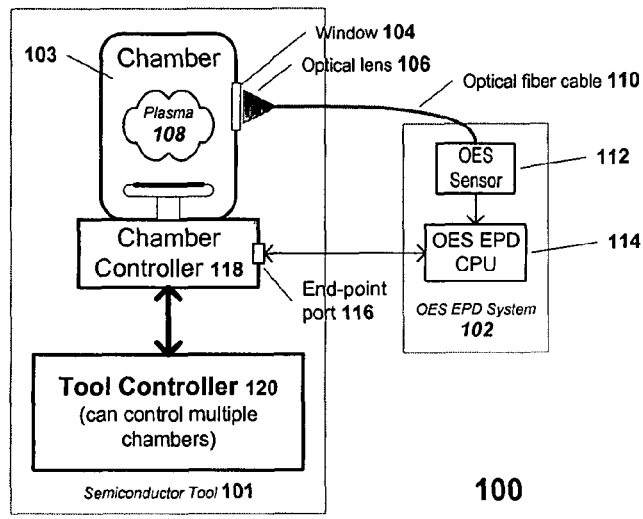
Figure 1: Simplified block diagram of plasma etcher with integrated OES EPD system
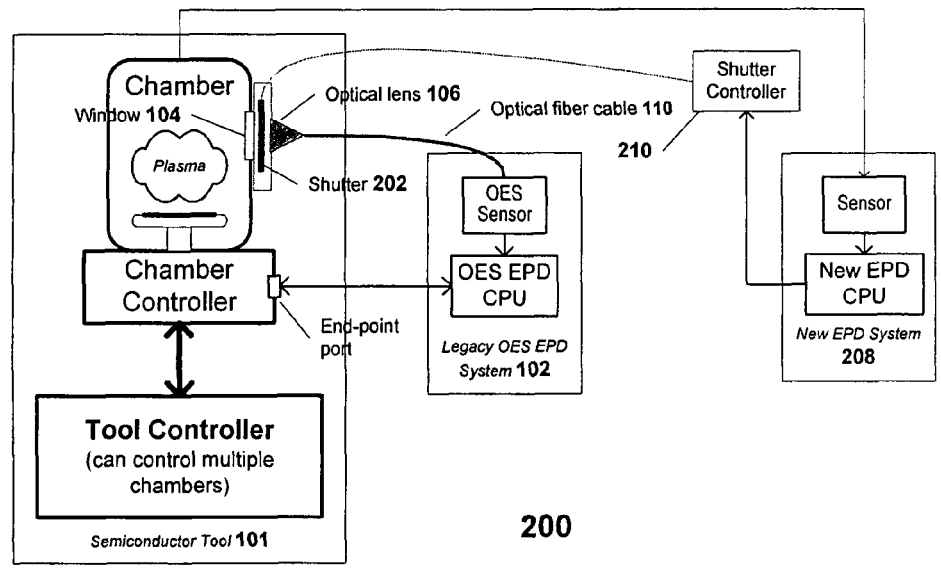
Figure 2: Simplified block diagram of new EPD system using a shutter to cause legacy OES EPD system to call end-point

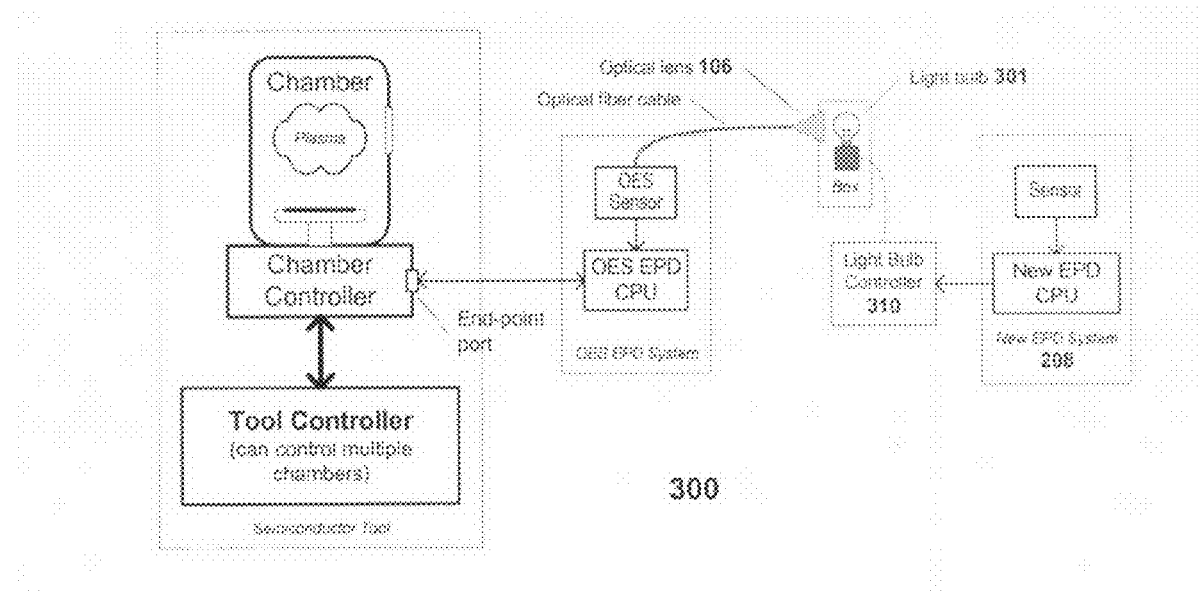
Figure 3: Simplified block diagram of new EPD system using a light bulb to cause legacy OES EPD system to call end-point
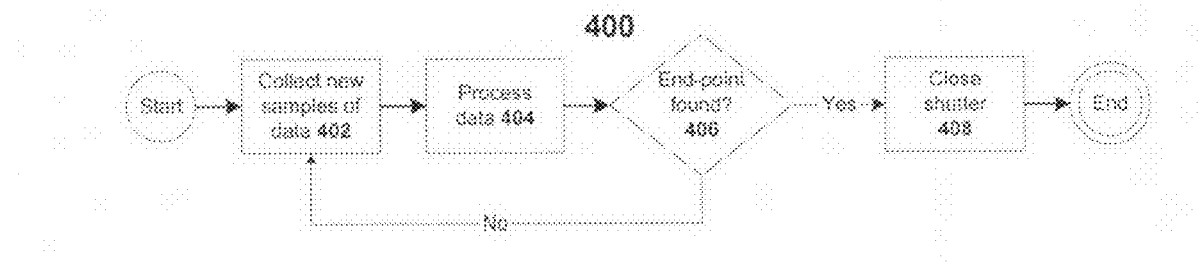
Figure 4: High level process flow of new EPD system for calling end-point on the tool
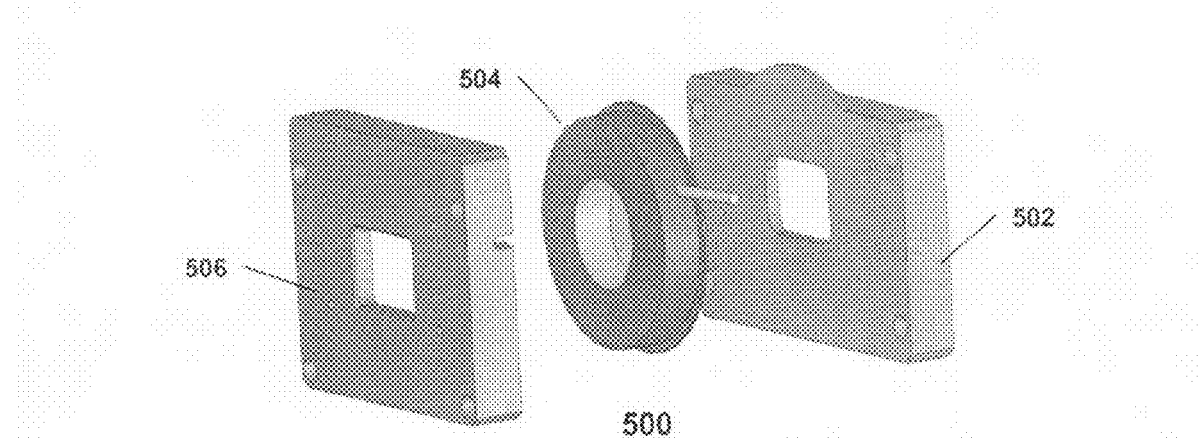
Figure 5A: Example shutter mounting – exploded view

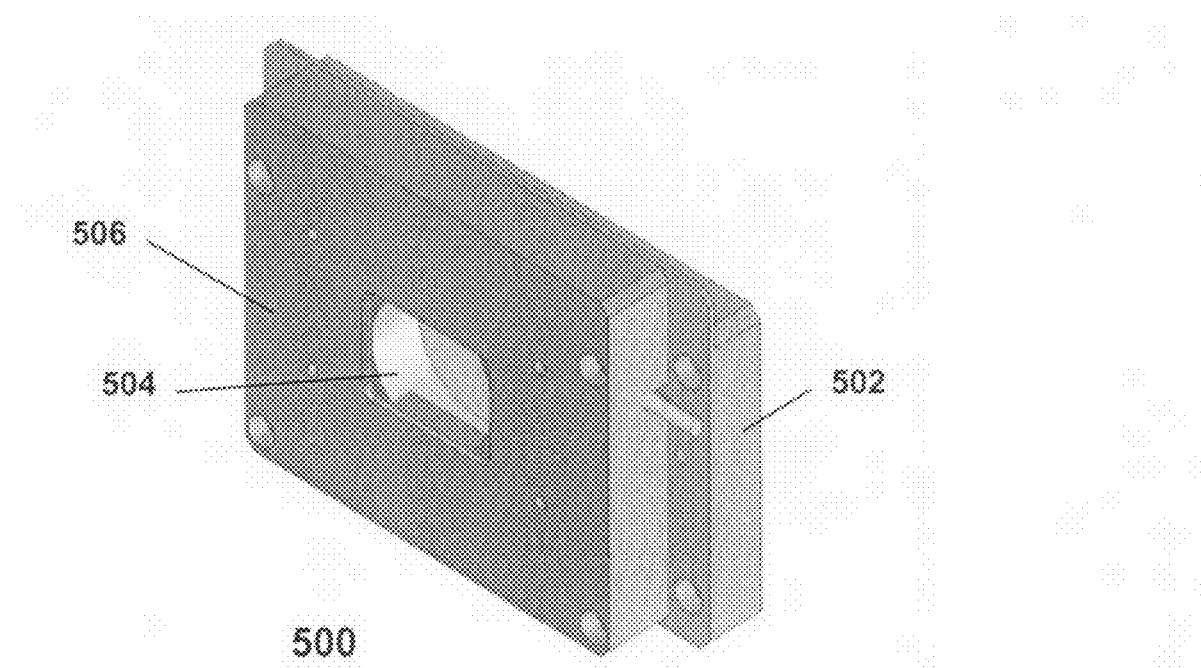
Figure 5B: Example shutter mounting – assembled view
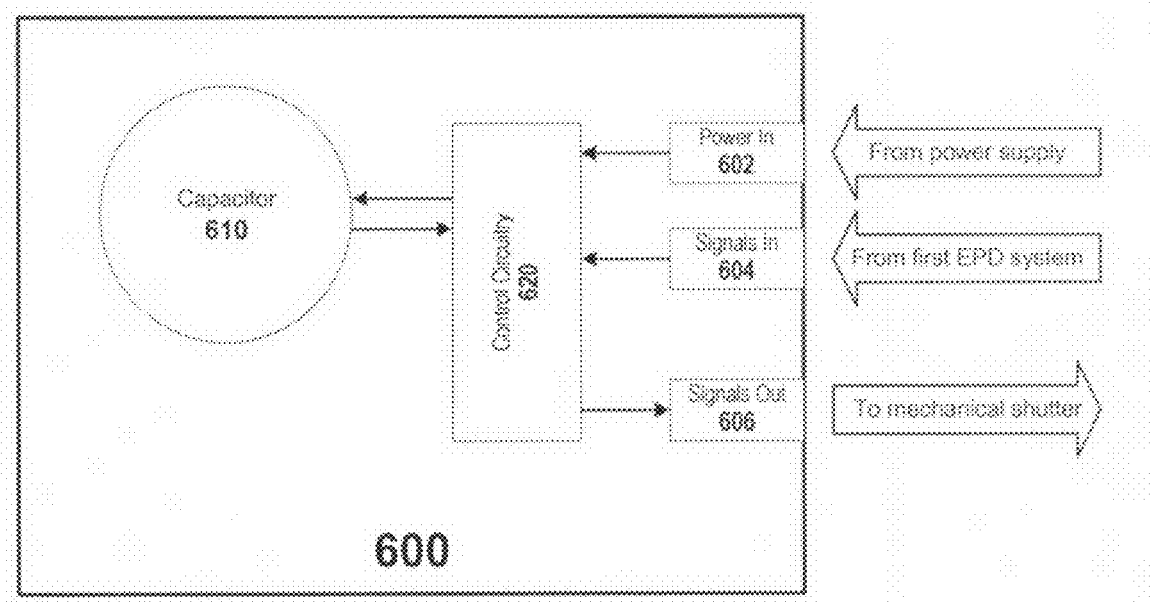
Figure 6: Block diagram of an embodiment of a shutter controller

SYSTEM AND METHOD FOR CONTROLLING PROCESS END-POINT UTILIZING LEGACY END-POINT SYSTEM

BACKGROUND OF THE INVENTION

Many semiconductor processing tools use an end-point determination (EPD) system to call active end-point on a process chamber. Major semiconductor processing tool vendors such as Applied Materials, Lam Research, and Tokyo Electron supply processing tools equipped with optical emission spectroscopy (OES)-based EPD systems already integrated with the chambers. Using these legacy EPD systems, a process engineer can configure the EPD systems to cause a recipe step to end when specific end-point criteria are met. One example of such specific criteria is when the intensity at wavelength 780 nm falls by 20% in a 5-second window. Such criteria are defined to capture signal features that represent the end-point of that particular processing step. Actively calling end-point is beneficial because it allows control of the processing time which can counteract variations in wafer processing. By contrast, without an EPD system the processing time is fixed, regardless of variations in the wafer processing.

Although many semiconductor processing chambers come equipped with OES EPD systems as legacy components, these may not be used because their accuracy may be insufficient for production-level deployment. In recent years, third parties have offered EPD products exhibiting greater accuracy and dependability than the legacy OES EPD systems offered by major tool manufacturers. However, effective integration of such new EPD systems into the semiconductor tool can be difficult.

A variety of strategies can be attempted for integrating a new EPD system with a tool. However, these conventional approaches may offer certain limitations. For example, semiconductor tools are usually equipped with physical ports by which a legacy OES EPD system is configured to communicate with the tool. The communication protocol on these ports is usually proprietary, creating a barrier for integration of the new EPD system. Although an attempt can be made to reverse-engineer the end-point protocol, proprietary binary protocols are extremely difficult to interpret without the protocol specifications. Moreover, the procedures for proper handling of the exception cases necessary for production-level systems would not be known.

It is also possible to request the protocol specification from the original equipment manufacturer (the "OEM"). However, obtaining the cooperation of a large OEM may often be difficult.

A third conventional approach is to attempt to adopt other communications ports on the tool to interact with the new EPD system. Examples of such communications ports include the SEMI Equipment Communications Standard/High-Speed SECS Message Services (SECS/HSMS) ports commonly found on semiconductor tools. However, this approach may also not yield the desired result, as these other communications ports do not have commands tailored to end-pointing a recipe step. For example, while it may be possible to stop the step via a SECS command, processing of the wafer would stop entirely, requiring manual intervention to restore tool operation.

In view of the above, there is a need in the art for methods and apparatuses for the integration of external EPD systems into manufacturing tools.

BRIEF SUMMARY OF THE INVENTION

Embodiments in accordance with the present invention allow a second end-point determination (EPD) system to actively control the end-pointing of a semiconductor process chamber, by leveraging a legacy EPD system that is already integrated with the chamber. In one embodiment, the second EPD system controls a shutter that regulates the amount of light transmitted between a plasma light source and an optical emission spectroscopy (OES) sensor of the legacy OES EPD system. In this embodiment, the legacy OES EPD system is pre-configured to call end-point when an artificial end-point condition occurs, i.e. the intensity of light falls below a pre-set threshold. When the second EPD system determines an actual end-point condition has been reached, it closes the shutter, which causes the light intensity being read by the OES sensor to fall below the pre-set threshold. This in turn triggers an end-point command to the chamber from the legacy OES EPD system.

A method according to the present invention includes providing a first end-point determination (EPD) system and creating an artificial end-point condition that causes the first EPD system to determine that an end-point of a process run being performed by the processing tool has been reached. An apparatus according to the present invention includes circuitry configured to receive a signal, and in response to receiving the signal to output a second signal that results in a first end-point determination device (EPD) determining that a process end-point has been reached. A system according to the present invention includes a first end-point determination (EPD) system, and a second EPD system that is in communication with a chamber of a processing tool. The system further includes an apparatus to receive a first signal from the second EPD system indicating that a process occurring in the chamber has reached an actual end-point condition. The apparatus, in response, creates an artificial end-point condition which the first EPD system recognizes as an end-point of the process that is occurring in the chamber of the second EPD system.

Various additional objects, features and advantages of the embodiments of the present invention can be more fully appreciated with reference to the detailed description and accompanying drawings that follow.

BRIEF DESCRIPTION OF THE DRAWINGS

FIG. 1 is a simplified block diagram of plasma etching tool equipped with a conventional integrated OES EPD system FIG. 2 is a simplified block diagram of a plasma etching tool equipped according to an embodiment of the present invention.

FIG. 3 is a simplified block diagram of a plasma etching tool equipped according to an alternative embodiment of the present invention.

FIG. 4 is a simplified high level process flow of a method of operating a system in accordance with an embodiment of the present invention.

FIG. 5A is a simplified exploded view of an embodiment of a shutter mounting in accordance with the present invention. FIG. 5B is a simplified assembled view of the embodiment of the shutter mounting of FIG. 5B.

FIG. 6 is a simplified schematic view of one possible embodiment of a shutter controller in accordance with the present invention.

DETAILED DESCRIPTION OF THE INVENTION

Embodiments in accordance with the present invention allow a second end-point determination (EPD) system to actively control the end-pointing of a semiconductor process chamber, by leveraging a legacy EPD system already integrated with the chamber. In one embodiment, the second EPD system controls a shutter that regulates the amount of light transmitted between a plasma light source and an optical emission spectroscopy (OES) sensor of the legacy OES EPD system. In this embodiment, the legacy OES EPD system is pre-configured to call end-point when an artificial end-point condition occurs, i.e. the intensity of light falls below a pre-set threshold. When the second EPD system determines that an actual end-point condition has been reached, it closes the shutter which causes the light intensity being read by the OES sensor to fall below the pre-set threshold. This in turn triggers an end-point command to the chamber from the legacy OES EPD system.

Many plasma-based semiconductor manufacturing tools ship with OES EPD systems already integrated onto the chamber. A simplified block diagram of a system 100 that includes a typical plasma-based tool 101 equipped with a conventional integrated OES EPD system 102 is shown in FIG. 1.

Typically, the chamber 103 contains a window 104 where an optical lens 106 captures light being emitted by the plasma 108. The light is transmitted via an optical fiber cable 110 to an OES sensor 112, which measures the intensity of light at one or more wavelengths. The OES data is then streamed to a CPU 114 that processes the OES data and determines when an end-point has been reached.

The logic for when an end-point has been reached is usually customizable by the process engineer. This allows the process engineer to tailor the end-point determination parameters according to the particular recipe being run on the tool.

There could be many variations to the conventional system described in FIG. 1. For example, in some cases the end-point port 116 may reside at the Tool Controller rather than at the Chamber Controller, or the EPD CPU might only pre-process the OES data and the actual decision of when an end-point has occurred could happen at the chamber or tool controller.

The process engineer can usually select the appropriate algorithm and parameters to customize the end-point decision logic for different recipe steps. A number of different types of algorithms are usually available in these legacy OES EPD systems. Some examples of the types of algorithms typically available include, but are not limited to, slope-based algorithms which determine end-point when the slope of a trace of emission data from one or more wavelengths exceeds a configurable setting, threshold-based algorithms which determine end-point when the magnitude of a trace of emission data from one or more wavelengths exceeds or falls below a configurable threshold, and percent change algorithms which determine end-point when the magnitude of a trace of emission data from one or more wavelengths changes by more than the configurable percentage setting within a configurable amount of time.

If the protocol used by the end-point port on the chamber controller were not known, it would be difficult to integrate a new EPD system onto the chamber. However, given a working legacy OES EPD system in place, according to embodiments of the present invention, a new EPD system can piggy-back off of the legacy OES EPD system to cause an end-point command to be sent to the tool when desired.

In accordance with embodiments of the present invention, when a new EPD system recognizes that end-point has occurred, it causes the legacy OES EPD system to perceive that an end-point has occurred, with the ultimate result that the legacy EPD system sends an end-point command to the tool on behalf of the new EPD system. According to these embodiments, the legacy OES EPD system is configured to call end-point when a specific, easily reproducible condition occurs. The new EPD system is configured to produce the condition that will trigger the legacy OES EPD system into perceiving that an end-point has actually been reached. In accordance with a particular embodiment, the legacy OES EPD system is configured to call end-point when the light intensity measured by the OES sensor falls below an appropriately low pre-set threshold value. The new EPD system controls a shutter that can regulate the amount of light received by the legacy OES, such that by closing the shutter the light intensity falls below that threshold value. FIG. 2 shows a simplified block diagram illustrating an embodiment of such a system 200 in accordance with the present invention.

As shown in FIG. 2, a shutter 202 is placed between the chamber window 104 and the OES optical lens 106. The operation of the shutter aperture is turned over to the new EPD system 208. Whenever the new EPD system 208 wishes to send an end-point command to the tool, the new EPD system commands the shutter controller 210 to close the shutter. As a result, light transmission captured by the legacy OES system 102 falls below the pre-set threshold to reach an artificial end-point condition configured by a user. Reaching this artificial end-point condition in turn causes the legacy OES EPD system to send an end-point command to the tool 101. Using this method, the new EPD system is given the capability of deciding when an end-point should be called on the chamber.

In the particular embodiment of FIG. 2, the mechanical shutter is maintained open in the default state, and closed magnetically upon receiving an electrical pulse of sufficient strength. Such a shutter requires a low DC current to maintain it in the closed position, and will open when the DC current is removed. This functionality is implemented in an electronic assembly referred to as the shutter controller 210 of FIG. 2. In certain embodiments of the present invention, the shutter controller receives as input a +5V DC voltage indicating that the shutter is to be closed, and receives a voltage of 0V to indicate the shutter should remain open. Thus the new EPD system dictates the state of the shutter by toggling voltages to the shutter controller.

FIG. 6 is a simplified schematic view of one possible embodiment of a shutter controller in accordance with the present invention. Shutter controller 600 includes a power-in port 602 that is configured to receive power from a power supply. Shutter controller 600 also includes input port 604 configured to receive a signal from one EPD system indicating whether the shutter should be opened or closed.

Shutter controller 600 further includes circuitry, here capacitor 610 linked to control circuitry 620 that is in communication with the input port 604 and power in port 602. In response to receiving a signal from the EPD system indicating the shutter should be closed, the circuitry of the shutter controller discharges the capacitor to create a pulse on output port 606 that will cause the shutter to close. In addition, it outputs a low DC voltage on output port 606 to keep the shutter closed until the signal on input port 604 is changed. Thus in the embodiment of FIG. 2, the new EPD system can control shutter states by sending the appropriate signals to the shutter controller.

In the embodiment of FIG. 2, if all power is lost either to the shutter or to the controller, the shutter will default to its open state. This would desirably allow normal tool and OES EPD operation without interruption in the event of a power failure.

FIG. 3 shows a simplified block diagram of an alternative embodiment of a system 300 in accordance with the present invention. In this embodiment, similar results are achieved by placing a light source 301 such as a light bulb, in front of the legacy OES optical lens 106 and giving control of the light bulb intensity to the new EPD system 208. The new EPD system uses the light source controller 310 to keep the light bulb 301 on until it decides an end-point should be called, at which point the light bulb is turned off.

Similar results could also be achieved by using different combinations of end-point decision logic and light bulb/shutter states. For example, the legacy OES EPD system could be configured to use a percentage change algorithm where the percentage threshold is positive and sufficiently high, and the shutter could be continuously closed and only open to allow light through once an end-point command should be sent.

At a high level, the process flow 400 used by the new EPD system to call end-point according to the embodiment of FIG. 2 is shown in FIG. 4. In step 402, the new EPD system collects data samples, and in step 404 processes the incoming data until it determines that an actual an end-point condition has been reached. In step 406, when the new EPD system decides that an end-point command should be sent to the tool to stop the recipe step, in step 408 the shutter is closed, thus blocking the light into the OES EPD system. As the OES EPD system has been configured to recognize an artificial end-point condition (little or no light received) not typically encountered during the processing, the blockage causes the OES EPD system to recognize an artificial end-point condition and to notify the tool.

Certain practical hurdles may need to be addressed in order to utilize embodiments of the present invention. For example, the legacy OES sensor may double as a plasma on/off indicator. Thus, certain tools can be configured to check whether the OES sensor detects light at the beginning of a plasma step in order to see to see if the plasma has actually been lit. If the OES sensor does not detect light, then the tool assumes the plasma was not successfully lit and issues an alarm. In such an environment, anything placed in between the chamber window and the OES optical lens should not interfere with that plasma sensing operation. This hurdle can be overcome by choosing the embodiment described in FIG. 2, where the shutter is normally open and closes only when end-point is to be called, the shutter does not interfere with the normal operation of the OES sensor as it performs the plasma on/off check.

In other cases, the process engineer may want to utilize the legacy OES EPD system instead of the new EPD system, to call end-point for only certain selected recipe steps. Placing something between the chamber window and the OES optical lens could limit the use of the legacy OES EPD system for other steps not selected. Again, by having the shutter normally open in the embodiment of FIG. 2, the shutter does not interfere with the normal operation of the sensor of the legacy OES EPD system to monitor the plasma to detect the end-point itself.

Another issue for practical implementation is mounting the shutter between the chamber window and the OES optical lens. The OES optical lens usually contains a mounting that will attach snuggly to the chamber wall, covering the chamber window. Placing a shutter in between the window and the optical lens requires a new mounting with sufficient room for the shutter.

Accordingly, FIG. 5A shows a simplified exploded view of an embodiment of an example shutter mounting 500 in accordance with the present invention. The mounting consists of a back plate 502 which replaces the OES mounting plate that was originally attached to the chamber wall, and a front plate 506 that holds the shutter 504 in place. FIG. 5B shows a simplified assembled view of the shutter mounting of FIG. 5A where the shutter 504 is sandwiched in between the front plate 506 and the back plate 502.

The shutter mounting of FIGS. 5A-B represents only one example of such a structure useful in accordance with embodiments of the present invention. One skilled in the art will easily ascertain that different chamber models may require different shutter mountings, and that all such variations are encompassed by different embodiments of the present invention.

Moreover, while the embodiment of FIG. 2 depicts placement of the shutter at the chamber window, this is not required by the present invention. The location of the shutter can vary, with it being positioned anywhere in the path of light transmission between the plasma light source and the light-sensing mechanism of the OES sensor. For example, according to one embodiment, the shutter could be placed inside the chamber window. According to another embodiment, the shutter could be placed directly in front of the legacy OES sensor, or even inside the OES sensor in front of the CCD. According to still another embodiment, the shutter could be placed in the middle of the optical cable.

The actual location chosen for the shutter depends mostly on practical considerations, since some locations will be prove more accessible than others. One of skill in the art will recognize that a variety of locations for the shutter in the light transmission path between the light source and the OES sensor's light-sensing mechanism are possible for different embodiments of the present invention.

Another consideration is the type of shutter used, and the resulting mechanism by which the new EPD system controls the light transmission through the shutter. The specific embodiment of FIG. 2 utilizes a mechanical shutter that physically reduces an aperture in order to prevent transmission of light through the shutter. However, the present invention is not limited to use of a mechanical shutter, and any device allowing for variable attenuation of light could be used.

For example, an LCD screen could be used to throttle the transmission of light between the plasma source and the OES sensor. The lack of moving parts in the LCD screen could enhance the reliability and lifetime of such a configuration. Alternatively, a variable filter could be used to attenuate one or more wavelengths of light. One skilled in the art would recognize that use of any such mechanisms (with their corresponding controllers) can alter optical transmission in order to control the amount of light captured by an OES sensor.

Embodiments in accordance with the present invention are not only useful for situations for by-passing use of a legacy end-point system. Alternative embodiments in accordance with the present invention could also be used to allow a chamber or tool to utilize more than one EPD system at the same time.

In order for a chamber to utilize two different EPD systems interchangeably, the chamber could require the physical addition of a second end-point port. However, rather than physically modifying the tool or chamber hardware to add an additional port, embodiments in accordance with the present invention may allow the second EPD system to work without affecting the first EPD system.

For example, a process engineer could configure the legacy OES EPD system to operate normally on some recipe steps, and configure the new EPD system to ignore those recipe steps. Since in the present embodiment the shutter is normally open, the shutter does not interfere with the normal operation of the legacy OES EPD system. For the recipe steps that the process engineer wishes to control using the new EPD system, he would configure the new EPD system to control those specific steps, and he would also configure the legacy OES EPD system to call end-point when the light intensity falls below a pre-set threshold. In this manner, both EPD systems can be used interchangeably on different recipe steps without requiring the addition of a second physical end-point port on the chamber.

While FIGS. 2 and 3 above have discussed use of the invention in connection with a plasma etching tool, embodiments in accordance with the present invention are not limited to this particular application. Examples of other types of semiconductor processing tools to which the instance invention could be applied, but are not limited to, include ashing, deposition, chemical mechanical polishing and lithography. Examples of manufacturers of semiconductor fabrication tools include but are not limited to Applied Materials, Inc., Lam Research Corp., Tokyo Electron Limited, Novellus Systems, Inc., ASM International N.V., Hitachi Limited, Canon, Inc., and Fujitsu Limited.

And while the above description has focused upon the use of the invention in connection with a tool employing optical end-point detection, embodiments in accordance with the present invention are not limited to this particular application. In accordance with alternative embodiments, the concept of inducing a legacy EPD system into calling end-point on behalf of a new EPD system can be applied to semiconductor fabrication tools equipped with alternative types of end-point detection apparatuses. For example, the same invention can be applied to tools with different types of EPD systems, including radio frequency (RF), residual gas analysis (RGA), laser, motor current, infrared (IR), interferometry and a variety of other types of EPD systems.

Furthermore, embodiments in accordance with the present invention are not limited to uses in the semiconductor industry. Other industries in which this invention may be applicable include but are not limited to the manufacture of plasma and liquid crystal displays, solar panel manufacturing, industrial diamond manufacturing, and other industries employing tools similar to those used in semiconductor manufacturing.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method comprising:
providing a first end-point determination (EPD) system of a processing tool;
monitoring a process in the processing tool using a second EPD system; and
creating an artificial end-point condition using the second EPD system that causes the first EPD system to determine that an end-point of the process run on the processing tool has been reached, whereby the first EPD system sends an end-point command to the processing tool.

2. A method according to claim 1 further comprising configuring the first EPD system to recognize the artificial end-point condition as an end-point.

3. A method according to claim 1 wherein the second EPD system creates the artificial end-point condition upon determining that the process has reached the end-point.

4. A method according to claim 3 wherein the first EPD system notifies the processing tool that the end-point has been reached.

5. A method according to claim 1 wherein the first EPD system determines the end-point based upon measurements from an optical emissions spectroscopy (OES) sensor.

6. A method according to claim 5 wherein the first EPD system determines the end-point when an intensity of light being measured by the OES sensor crosses a threshold.

7. A method according to claim 6 wherein the artificial end-point condition is created by controlling a shutter to regulate an intensity of light received by the OES sensor.

8. A method according to claim 6 wherein the artificial end-point condition is created by controlling a light source to regulate an intensity of light received by the OES sensor.

9. A method according to claim 1 wherein the first EPD system determines the end-point based on a measurement selected from an optical signal measurement, a radio frequency measurement, a residual gas analysis (RGA) measurement, or an interferometer measurement.

10. An apparatus comprising:
an input port configured to receive a signal; and
circuitry in communication with the input port and configured to receive the signal, and in response to output a second signal corresponding to an artificial condition that results in a first end-point determination (EPD) device determining that a process end-point has been reached, whereby the first EPD device sends an end-point command to a processing tool.

11. An apparatus according to claim 10 wherein the circuitry is configured to receive the signal from another EPD device.

12. An apparatus according to claim 10 wherein the circuitry comprises a capacitor.

13. An apparatus according to claim 10 wherein the circuitry comprises a processor.

14. An apparatus according to claim 10 wherein the circuitry is configured to receive power from a power supply and to amplify the received power to generate the second signal.

15. A system comprising:
a first end-point determination (EPD) system;
a second EPD system in communication with a chamber of a processing tool;
an apparatus configured to receive a first signal from the second EPD system indicating that a process occurring in the chamber has reached an actual end-point condition, and in response to create an artificial end-point condition which the first EPD system recognizes as an end-point of the process, whereby the first EPD system sends an end-point command to the processing tool.

16. A system according to claim 15 wherein the apparatus is configured to output a second signal in response to receipt of the first signal, the apparatus further comprising a device configured to communicate with the first EPD system in response to receipt of the second signal.

17. A system according to claim 16 wherein the device comprises one of a mechanical shutter, a liquid crystal device, a filter, or a light source configured to regulate an amount of light communicated to the first EPD system.

18. A system according to claim 15 wherein first EPD system comprises an Optical Emission Spectroscopy (OES) sensor.

19. A system according to claim 15 wherein first EPD system includes at least one of an optical sensor, a radio frequency sensor, a residual gas analysis (RGA) sensor, or an interferometer.

* * * * *